United States Patent
Ellis et al.

[11] Patent Number: 6,121,106
[45] Date of Patent: *Sep. 19, 2000

[54] METHOD FOR FORMING AN INTEGRATED TRENCH CAPACITOR

[75] Inventors: Wayne F. Ellis, Jericho; Russell J. Houghton, Essex Junction; Max G. Levy, Essex Junction; William R. Tonti, Essex Junction, all of Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/038,395

[22] Filed: Mar. 11, 1998

[51] Int. Cl.$^7$ .................................................... H01L 21/20
[52] U.S. Cl. .............................................. 438/386; 438/248
[58] Field of Search ................................... 438/243, 248, 438/386, 391, 430

[56] References Cited

U.S. PATENT DOCUMENTS 5,776,808  7/1998  Muller et al. ........................... 438/243

*Primary Examiner*—Tuan H. Nguyen
*Attorney, Agent, or Firm*—Schmeiser, Olsen, & Watts; Robert A. Walsh

[57] ABSTRACT

A shallow trench capacitor is disclosed that is fabricated by forming a shallow trench in a substrate extending below a surface of the substrate. A dielectric layer having a preselected thickness is grown in the shallow trench, and a polysilicon layer is deposited over the dielectric layer. The polysilicon layer is then planarized down to the nitride or pad layer forming a capacitor. By utilizing a non-critical mask to open up selected regions, isolation structures may then be formed through shallow trench technology.

7 Claims, 5 Drawing Sheets

METHOD FOR FORMING AN INTEGRATED TRENCH CAPACITOR

BACKGROUND OF THE INVENTION

1. Technical Field

The invention relates generally to integrated circuits formed using trench structures, and more specifically, to shallow trench capacitor structures.

2. Background Art

As more circuits are packed onto a given semiconductor substrate, more thought has been devoted to not only orienting the various devices in a planar fashion along the surface of the substrate, but to orienting the devices vertically by either building the devices up from the substrate surface or by burying the devices in trenches formed within the face of the semiconductor body. Some examples of trench structures include trench capacitors, which have been used in dynamic random access memory (DRAM) cells and other circuits to try and further reduce the overall area of the cell. Examples of trench capacitors are found in the following U.S. patents: U.S. Pat. No. 4,694,561, "Method of Making High-Performance Trench Capacitors for DRAM Cells", issued September 1987 to Lebowitz; U.S. Pat. No. 4,859,615, "Semiconductor Memory Cell Capacitor and Method for Making the Same", issued August 1989 to Tsukamoto et al.; U.S. Pat. No. 4,889,492, "High Capacitance Trench Capacitor and Well Extension Process", issued December 1989 to Barden et al.; and U.S. Pat. No. 5,466,628, "Method of Manufacturing Trench Capacitor With a Recessed Field Oxide Layer", issued November 1995 to Lee et al.

There are several problems, though, with fabricating a capacitor used for high density DRAMS and logic technologies, such as for decoupling or storage. One problem is the fabrication area required of this capacitor makes it undesirable to use the planar silicon area. Hence, a deep trench has been used in fabricating capacitors with minimal area. However, a second problem ensues with using a deep trench capacitor in high density DRAMS and logic technologies- the dielectric of the deep trench capacitor cannot reliably withstand maximum operating voltage conditions.

SUMMARY OF THE INVENTION

It is thus an advantage of the present invention to provide a shallow trench capacitor and the method of making the same that eliminates the above described defects.

The advantages of the invention are realized by a shallow trench capacitor that is fabricated by forming a shallow trench in a substrate extending below a surface of the substrate. A dielectric layer having a preselected thickness is grown in the shallow trench, and a polysilicon layer is deposited over the dielectric layer. The polysilicon layer is then planarized down to the nitride or pad layer forming a capacitor. By utilizing a non-critical mask to open up selected regions, isolation structures may then be formed through shallow trench technology.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
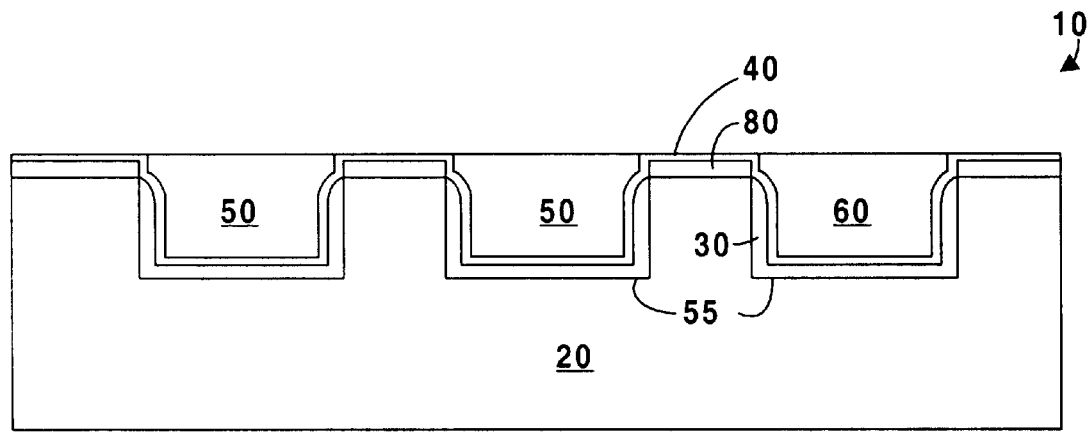
FIG. 1 is a simplified diagram of a semiconductor device in accordance with a preferred embodiment of the present invention.

Referring to FIG. 1, there is shown, in highly simplified form, a semiconductor structure for an integrated circuit 10, such as a DRAM cell or logic circuit, in accordance with the present invention. In this structure, a substrate 20 is covered by a pad layer 80, usually a nitride cap, which acts as a polish stop in subsequent processing. Trenches 55 are formed through the pad layer 80 and into substrate 20. Trenches 55 are covered by a high quality dielectric layer, such as oxide 30. A nitride layer 40 is deposited over the structure and a nitride layer 40. Shallow trench capacitors (STC) 50 are formed using a doped polysilicon material. An isolation structure 60, (e.g., shallow trench isolation or STI), is formed using an isolation material, such as oxide, which, like the doped polysilicon material, is recessed into the substrate 20. One advantage of the present invention is the ability to utilize existing shallow trench technology to form the STC, as will be seen in reference to FIGS. 2–8. Furthermore, the STC uses two-thirds less area than a similar planar based capacitor of equivalent dielectric thickness. The STC may be successfully used as a decoupling capacitor for a high density DRAM and logic circuit (e.g., 64 Megabytes (M) and beyond), because the STC has an adequate oxide thickness to sustain a power supply voltage and utilizes a small chip area.

Figure 2:
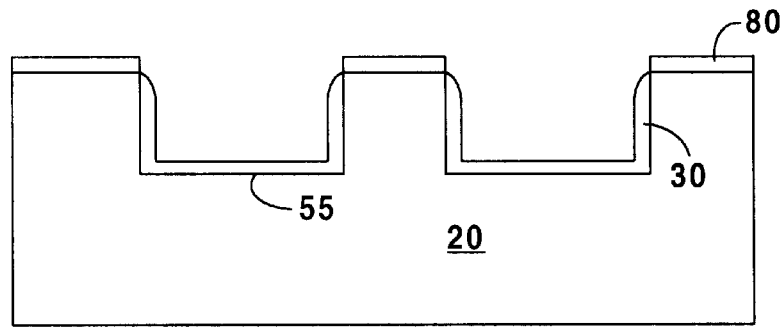
FIGS. 2, 3, 4, 5, 6, 7 and 8 are cross-sectional views showing a fabrication sequence of FIG. 1 in accordance with a preferred embodiment of the present invention.

Referring now to FIGS. 2–8, fabrication of a preferred embodiment of the present invention will be discussed. As seen in FIG. 2, two shallow trenches 55 have been etched through the pad layer 80 for regions of isolation in shallow trench technology. While only two trenches are shown, it will be appreciated that a plurality of such trenches may be employed on a single semiconductor substrate, each delineating a subsequent active area of a device. A high quality dielectric 30, such as an oxide, is then grown or deposited over the silicon substrate 20 and trenches 55. The thickness and the composition of the dielectric 30 may be independently chosen to provide the optimum operating point between capacitance and voltage operation, without compromising the technology gate dielectric. As can be seen, although the trenches were originally etched for isolation regions, capacitors may also be formed in these trenches as described by the present invention.

Figure 3:
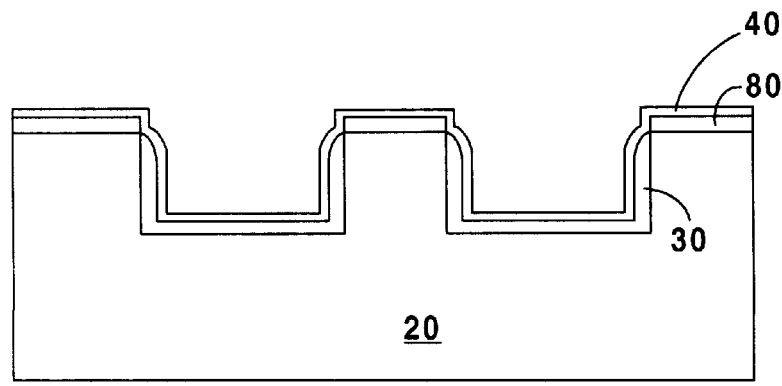

Referring now to FIG. 3, a nitride layer 40 is deposited over the dielectric 30 and the pad layer 80. The pad layer 80, as will be seen in subsequent figures, is important to the formation of the STC and isolation structures. The hardness and resistance of the pad layer 80 to a chemical/mechanical polishing process allows the planarization of the STC and isolation structure to be self-limiting. Nitride layer 40 prevents the substrate at the top corner or STI from being etched during the poly strip step.

Figure 4:
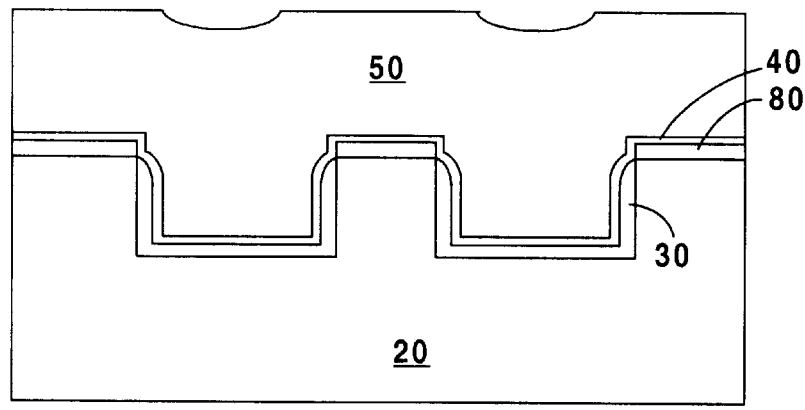
Figure 5:
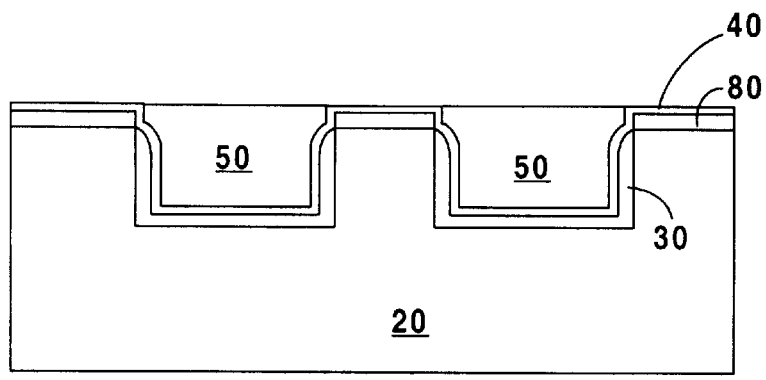

A layer of in-situ doped polysilicon 50 is then deposited as seen in FIG. 4. The deposited doped polysilicon 50 will be used later as the capacitor plate. Although the nitride layer 40 remains with the formation of the STC as shown in FIG. 4, the nitride layer 4 may also be removed during this step. As seen in FIG. 5, the doped polysilicon 50 is then planarized to the surface of either the nitride layer 40 or the pad layer 80, if the nitride layer 40 is removed, resulting in the formation of the STC 50.

Figure 6:
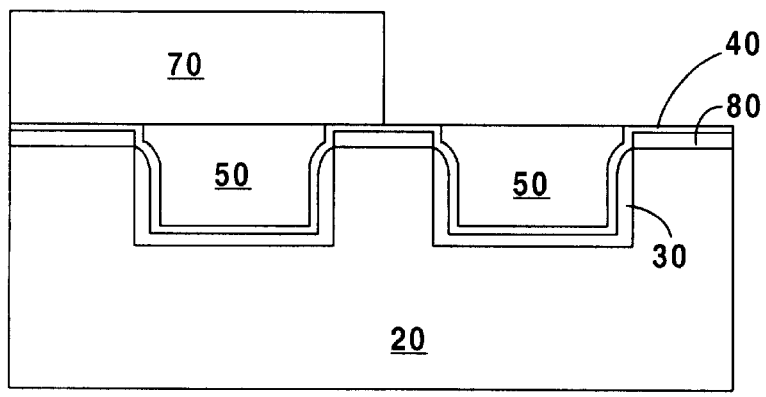
Figure 7:
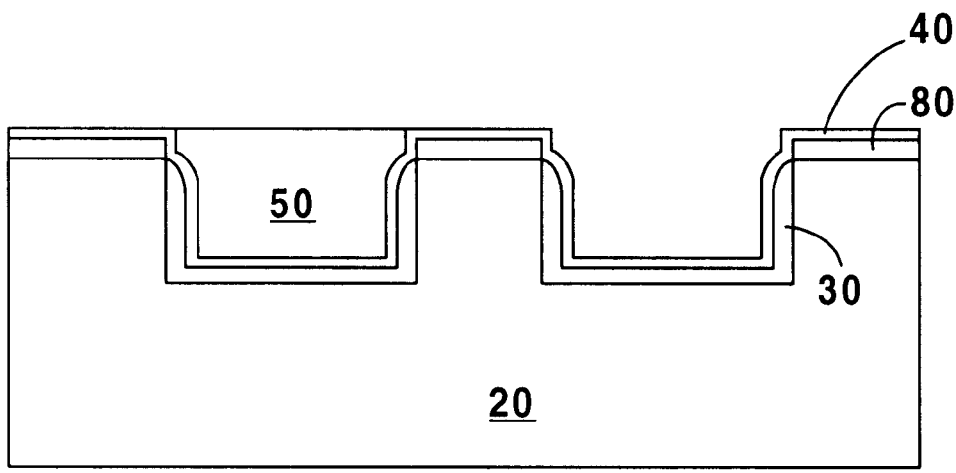
Figure 8:
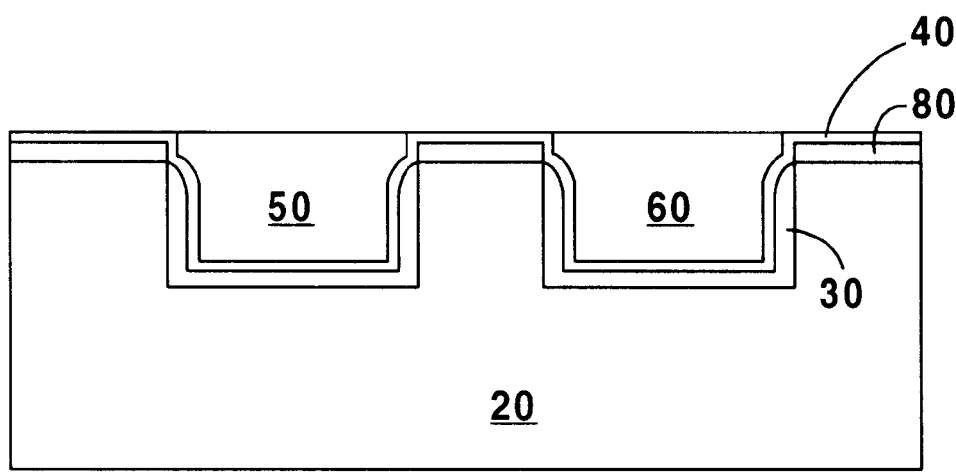

As seen in FIGS. 6, 7 and 8, an STC non-critical mask 70 is now used to define the regions where the doped polysilicon 50 will be selectively etched to form an isolation structure 60. FIG. 8 illustrates the resulting defined regions of doped polysilicon STC 50 and the standard isolation structure 60 after the STI oxide is deposited or grown as is known in the art. The STC may then be contacted through standard diffusion contact and metallurgy.

Figure 9:
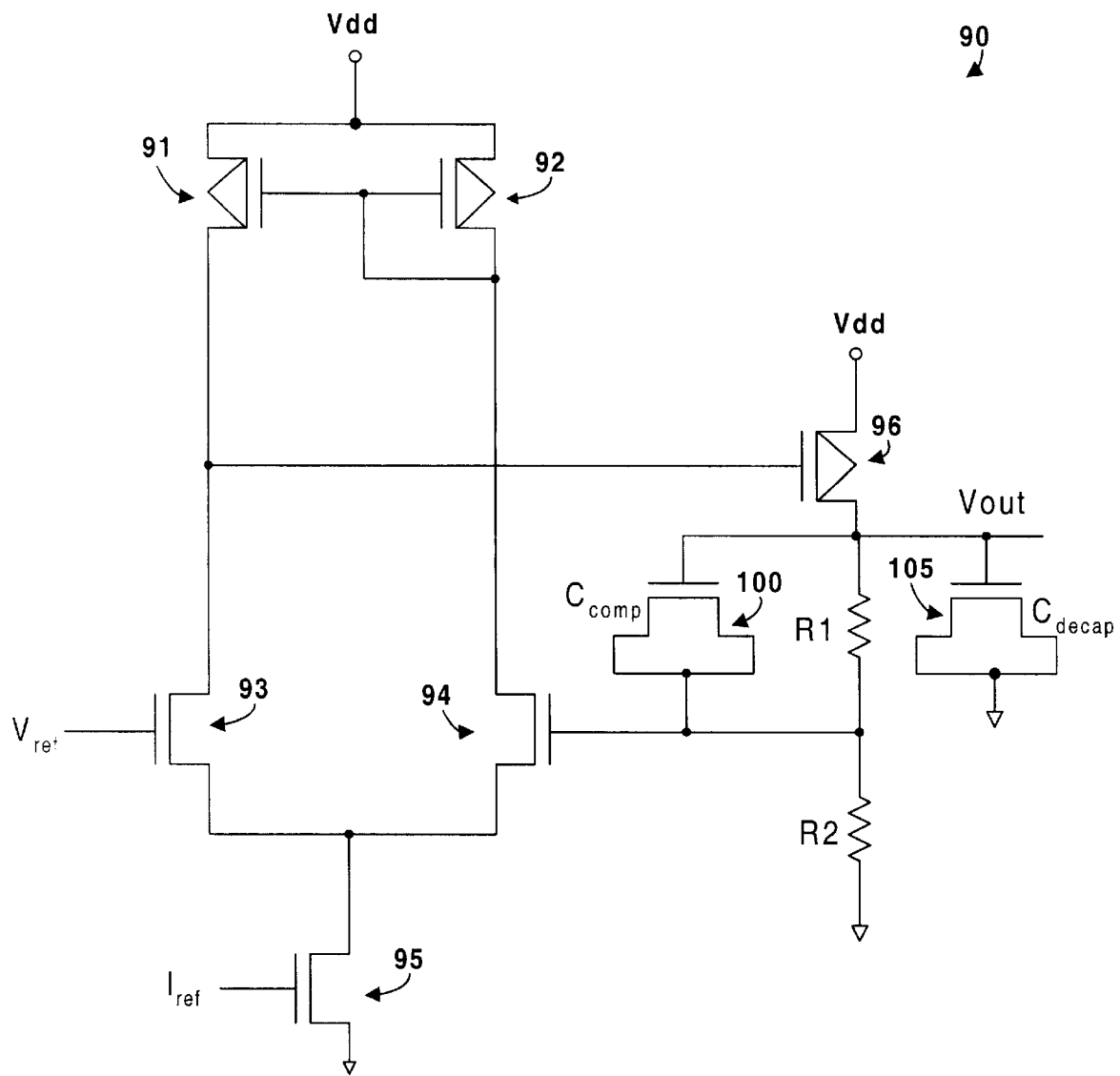
FIG. 9 is a circuit diagram of a feedback regulator using conventional MOS capacitors.
Figure 10:
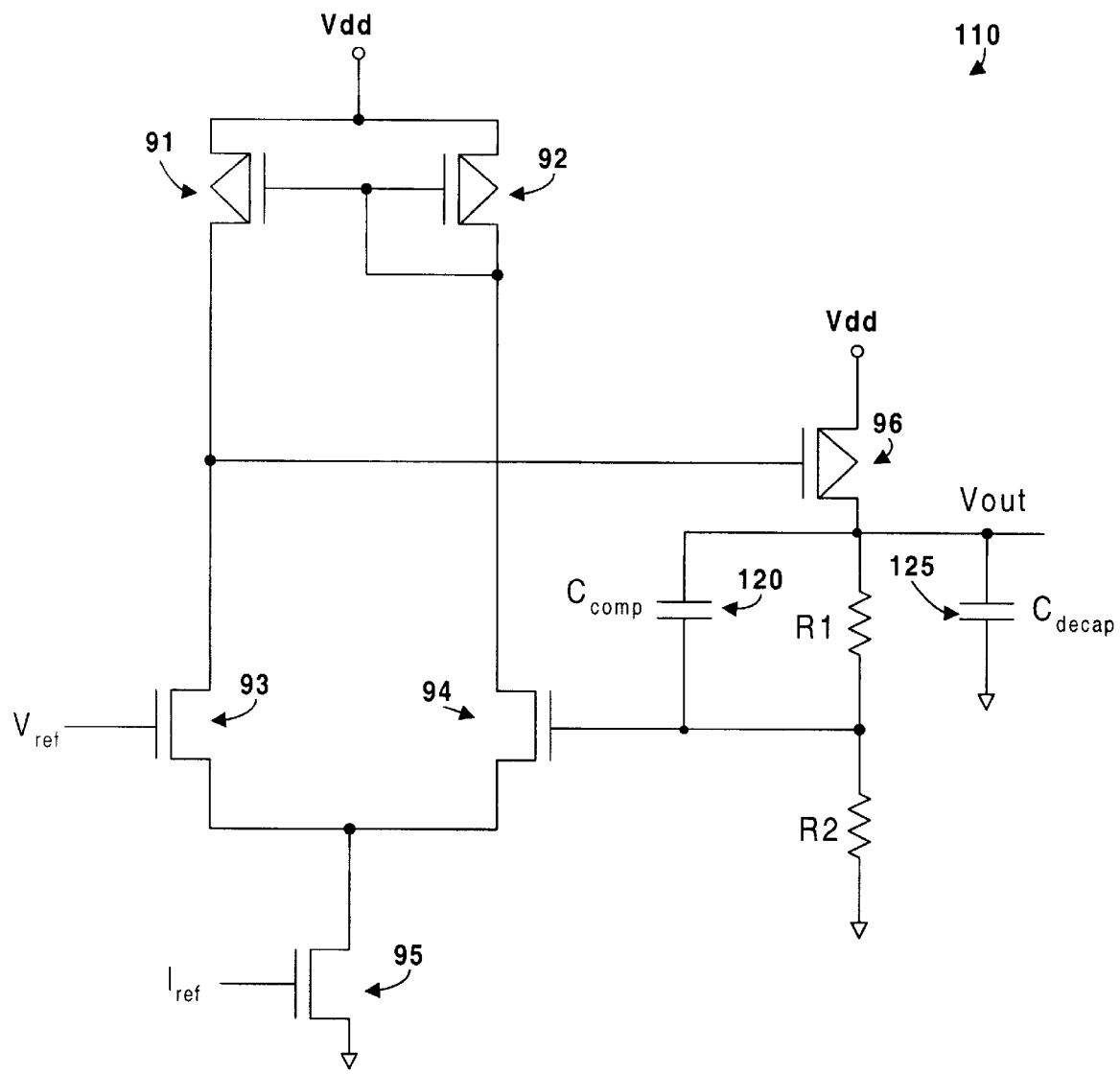
FIG. 10 is a circuit diagram of a feedback regulator using shallow trench capacitors in accordance with an embodiment of the present invention.

FIGS. 9 and 10 illustrate the use of a conventional MOS capacitor (FIG. 9) in a typical feedback regulator circuit 90 as opposed to the use of the STC of the present invention (FIG. 10) in a similar circuit 110. The feedback regulator circuit, which is critically dependent upon capacitance, is used to generate chip internal voltages.

As seen in FIG. 9, the feedback regulator circuit 90 comprises a voltage reference (Vref) signal coupled to the gate of n-channel MOSFET (NMOS) 93. The source of NMOS 93 is coupled the source of NMOS 94 and to ground through NMOS 95, wherein the gate of NMOS 95 receives a current reference (Iref) signal. The drain of NMOS 93 is coupled to the drain of a p-channel MOSFET (PMOS) 91 and to the gate of PMOS 96. The source of PMOS 91 is coupled to the source of PMOS 92 and to Vdd. The gate of PMOS 91 is coupled to the gate and drain of PMOS 92 and to the drain of NMOS 94. The gate of NMOS 94 is coupled to the compensating MOS capacitor (Ccomp) 100 and to resistors R1 and R2, R2 being tied to ground. The source of PMOS 96 is coupled to Vdd and the drain of PMOS 96 is coupled to Ccomp 100, R1, the regulated output Vout, and decoupling MOS capacitor (Cdecap) 105. Cdecap 105 is tied to ground. Vout is determined by the resistor ratio R1/R2 and Vref. A good transient load response and stable operation will depend upon the decoupling capacitor Cdecap 105. Ccomp 100 also contributes to the stable operation of the circuit and provides high frequency phase compensation for any stray capacitance associated with the implementation of resistors R1 and R2 and the input capacitance of the amplifier. Ccomp is typically a standard threshold MOS (i.e., comprises the standard threshold of an NMOS). If a voltage drop across R1 is below or slightly above the threshold, though, a depletion MOS capacitor may be required for Ccomp. One problem with using MOS capacitors in a feedback regulator circuit is that at high frequencies, a series resistance can degrade the capacitors' effectiveness.

In contrast, the capacitance requirements of the feedback regulator circuit 110 are more effectively complied with using the shallow trench capacitors in accordance with the present invention. The elements of FIG. 10 are similar to FIG. 9 except Ccomp 120 and Cdecap 125 are now STCs in accordance with the present invention. The decoupling capacitor, Cdecap 125 has a higher capacitance per unit area than the equivalent MOS capacitor, thus resulting in a chip area reduction. Furthermore, using Cdecap 125 and Ccomp 120 eliminates the problems associated with the threshold dependance of the MOS capacitors as explained above. That is, the capacitor of the present invention is substantially electrically equivalent to a parallel plate capacitor.

Thus, this invention provides a shallow trench capacitor that can be fabricated through shallow trench technology, wherein the dielectric thickness may be independently chosen and the lower plate does not have to be of a lower potential than the upper plate as with typical MOS capacitors. That is, the potential on the lower plate or plates of the capacitor is independent of the potential on the upper plate of the capacitor. Furthermore, the shallow trench capacitor as disclosed by the present invention uses two-thirds less area than a similar planar based capacitor of equivalent dielectric thickness.

While the invention has been particularly shown and described with reference to a preferred embodiment thereof, it will be understood by those skilled in the art that the foregoing and other changes in form and details may be made therein without departing from the spirit and scope of the invention, i.e., forming poly caps after STI formation.

What is claimed is:

1. A method for forming trench capacitors and isolation structures using trench technology comprising the steps of:
   a) etching a plurality of trenches in a substrate;
   b) forming a dielectric layer in said trenches;
   c) forming a polysilicon layer over said dielectric layer;
   d) planarizing the polysilicon layer to form a plurality of capacitors;
   e) etching said polysilicon layer from selective regions in the trenches; and
   f) forming isolation structures in said selective regions.

2. The method of claim 1, wherein a non-critical mask determines the selective regions for forming said isolation structures.

3. The method of claim 1, wherein said dielectric has a predetermined thickness that is independently chosen for specific capacitor characteristics.

4. The method of claim 1, wherein said dielectric has a composition that is independently chosen for specific capacitor characteristics.

5. The method of claim 1, further comprising the step between step b) and step c):
   depositing a nitride layer over said dielectric layer.

6. The method of claim 1, wherein said capacitor is substantially electrically equivalent to a parallel plate capacitor.

7. The method of 1, wherein a potential of a lower plate of said capacitor is independent of a potential of an upper plate of said capacitor.

* * * * *